(12) United States Patent
Fukuizumi

(10) Patent No.: US 6,720,647 B2
(45) Date of Patent: Apr. 13, 2004

(54) SEMICONDUCTOR DEVICE AND METHOD OF MANUFACTURING THE SAME

(75) Inventor: Akira Fukuizumi, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/871,943

(22) Filed: Jun. 4, 2001

(65) Prior Publication Data

US 2001/0048156 A1 Dec. 6, 2001

(30) Foreign Application Priority Data

Jun. 5, 2000 (JP) .................................. 2000-166962

(51) Int. Cl.[7] .............................................. H01L 23/12
(52) U.S. Cl. ...................... 257/704; 257/698; 257/774; 257/787
(58) Field of Search .............................. 257/666, 678, 257/701, 702, 704, 710, 711, 773, 774, 778, 780, 781, 782, 783, 784, 786, 698, 787

(56) References Cited

U.S. PATENT DOCUMENTS

| | | | | |
|---|---|---|---|---|
| 3,995,300 A | * | 11/1976 | Masumura et al. ............ 257/43 |
| 5,459,368 A | * | 10/1995 | Onishi et al. ............ 310/313 R |
| 5,616,520 A | * | 4/1997 | Nishiuma et al. ............ 438/125 |
| 5,699,027 A | * | 12/1997 | Tsuji et al. .................. 333/193 |
| 5,723,904 A | * | 3/1998 | Shiga .......................... 257/698 |
| 5,786,271 A | | 7/1998 | Ohida et al. |
| 5,814,890 A | | 9/1998 | Iwasaki ....................... 257/778 |
| 5,909,056 A | * | 6/1999 | Mertol ........................ 257/704 |
| 6,166,433 A | | 12/2000 | Takashima et al. |
| 6,225,694 B1 | * | 5/2001 | Terui ............................ 257/704 |
| 6,232,152 B1 | * | 5/2001 | DiStefano et al. ........... 438/124 |
| 6,239,980 B1 | * | 5/2001 | Fillion et al. ................ 361/760 |
| 6,246,115 B1 | * | 6/2001 | Tang et al. .................. 257/706 |
| 6,340,838 B1 | * | 1/2002 | Chung et al. ................ 257/668 |

FOREIGN PATENT DOCUMENTS

| | | | |
|---|---|---|---|
| JP | 58225659 A | * | 12/1983 |
| JP | 59-92558 | | 5/1984 |
| JP | 05095053 A | * | 4/1993 |
| JP | 5-267549 | | 10/1993 |
| JP | 6-37122 | | 2/1994 |
| JP | 7-245360 | | 9/1995 |
| JP | 8-125051 | | 5/1996 |
| JP | 9-22968 | | 1/1997 |
| JP | 10-209204 | | 8/1998 |
| JP | 11-3901 | | 1/1999 |
| JP | 11-67799 | | 3/1999 |
| JP | 11-135523 | | 5/1999 |
| JP | 2000-25074 | | 1/2000 |
| JP | 2000-138246 | | 5/2000 |

\* cited by examiner

*Primary Examiner*—George Eckert
*Assistant Examiner*—Chris C. Chu
(74) *Attorney, Agent, or Firm*—Foley & Lardner

(57) ABSTRACT

In a semiconductor device, an insulating substrate has a plurality of through holes. A plurality of conductive posts are buried in the through-holes. The conductive posts are classified to at least one first conductive post and a pair of second conductive posts. A semiconductor element has at least one surface electrode at a surface side. The surface electrode is connected to the first conductive post by a face-down method. A metal block is formed to a square-arch shape in a cross sectional view and has a ceiling portion and both end portions. A back surface of the semiconductor element is secured to the ceiling portion while the both end portions are secured to the second conductive posts. A sealing-resin seals the semiconductor element.

5 Claims, 8 Drawing Sheets

SEMICONDUCTOR DEVICE AND METHOD OF MANUFACTURING THE SAME

BACKGROUND OF THE INVENTION

This invention broadly relates to a semiconductor device and a method of manufacturing the same.

More specifically, this invention is directed to a mounting structure of a power device.

In a conventional package of a power device, a semiconductor device such as a power device is generally provided by the use of a lead frame, and is resin-sealed by the known transfer molding method.

Referring to FIGS. 1A and 1B, description will be made about a method of mounting the power device disclosed in Japanese Unexamined Patent Publication (JP-A) No. Hei. 6-37122.

Before assembling the semiconductor device, a lead frame having a header (die pad) 21 and a lead 23 linked by a dam (tie bar) 26 is formed by punching a metal plate.

With this structure, a groove 28 is formed directly under a pellet-outer periphery portion of a pellet-attachment portion of an upper surface of the header 21.

As illustrated in FIG. 1A, the pellet 22 is attached on the header 21 by solder 25. Further, a wire 24 is connected between an electrode on the pellet 22 and the lead 23.

Subsequently, the lead frame provided with the pellet 22 is arranged in a sealing die, and is resin-sealed such that sealing resin 27 exposes the back surface of the header 21 and covers the upper surface thereof. After sealing the resin, each lead 23 is separated by cutting the dam 26.

In the above-mentioned mounting method, the lead frames are designed to different shapes in the case where the kinds of the devices are different to each other. Consequently, manufacturing equipments are fixed at every kinds, and a production line is not flexible.

Further, a specific lead frame die for forming a metal lead frame must be prepared at every kinds. These facts cause cost-up. Moreover, the number of the devices, which are made once from the lead frame, is reduced so as to lower production efficiency.

In consequent, it is difficult to cheaply provide the package for the power device in the conventional method.

SUMMARY OF THE INVENTION

It is therefore an object of this invention to provide a semiconductor device having a small-sized and cheap mounting structure.

In a semiconductor device according to this invention, an insulating substrate has a plurality of through holes.

A plurality of conductive posts are buried in the through-holes. In this case, the conductive posts are classified to at least one first conductive post and a pair of second conductive posts.

Further, a semiconductor element has at least one surface electrode at a surface side. Herein, the surface electrode is connected to the first conductive post by a face-down method.

Moreover, a metal block is formed to a square-arch shape in a cross sectional view and has a ceiling portion and both end portions. In this event, a back surface of the semiconductor element is secured to the ceiling portion while the both end portions are secured to the second conductive posts.

In addition, a sealing-resin seals the semiconductor element.

With this structure, the semiconductor element has a back surface electrode at a back surface side. The back surface electrode is connected to the second conductive posts via the metal block.

In this case, each of the first and second the conductive posts may be formed by the use of Cu paste.

Further, a first substrate electrode is formed on the first conductive post. The surface electrode is connected to the first conductive post via the first substrate electrode.

Herein, the first substrate electrode may be formed by the use of Ag paste.

Moreover, a second substrate electrode is formed on the second conductive post. The metal block is connected to the second conductive post via the second substrate electrode.

Herein, the second substrate electrode may be formed by the use of Ag paste.

In this case, the surface electrode comprises a bump electrode. The insulating substrate comprises a resin substrate.

Specifically, use is made of the insulating substrate such as the resin lamination plate. Further, the back surface electrode of the semiconductor device is drawn out into the side of the insulating substrate via the metal block which commonly serves as the heat sink. The semiconductor substrate is entirely resin-sealed, and is cut to the individual parts by the use of the dicer.

In consequence, the power device can be manufactured in the production line having high flexibility irrespective of the kinds of the equipments.

Further, the small-sized power device having high heat-dissipation characteristics can be realized in the mounting structure.

More specifically, the pellet is arranged on the insulating substrate having the conductive post by the use of the face-down method. Further, the metal block covers thereon such that the back surface electrode of the pellet can be drawn out to the conductive post.

After a plurality of pellets are entirely resin-sealed, the pellet is cut to the individual parts by the use of the dicer.

Consequently, the expensive manufacturing equipment is unnecessary. Further, it is possible to manufacture the semiconductor device in the production line having high flexibility and to effectively manufacture the semiconductor device.

Moreover, it is possible to cheaply provide the small-sized package having the high heat-dissipation characteristics without using the lead frame.

DESCRIPTION OF PREFERRED EMBODIMENTS (First Embodiment)

Figure 2A:
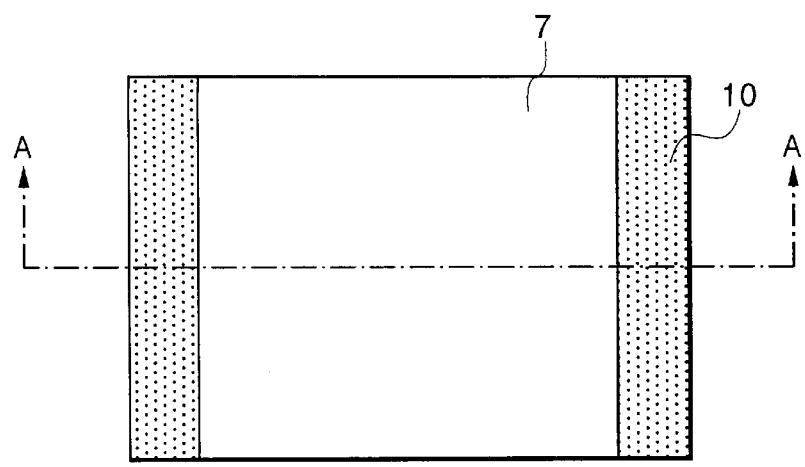
FIG. 2A is a plan view showing a semiconductor device according to a first embodiment.
Figure 2B:
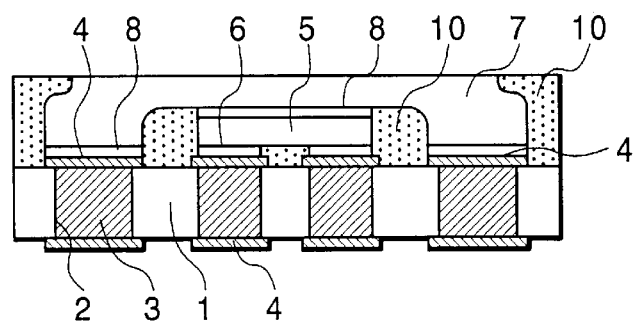
FIG. 2B is a cross sectional view showing a semiconductor device according to a first embodiment.
Figure 2C:
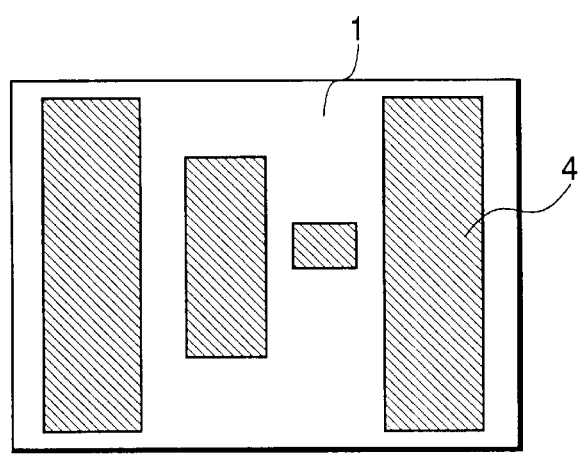
FIG. 2C is a bottom view showing a semiconductor device according to a first embodiment.

Referring to FIGS. 2A through 2C, description will be hereinafter made about a first embodiment.

As illustrated in FIGS. 2A through 2C, through-holes 2 are opened in a resin substrate 1 made of a glass epoxy resin laminating plate so as to penetrate the resin substrate 1. In this event, conductive posts 3 are buried in the through hole 2. Herein, each of the conductive posts 3 is formed by a Cu paste.

Substrate electrodes 4 are formed on the upper and lower surfaces of the conductive post 3 by the use of an Ag paste.

A pellet 5 having a bump electrode 6 is arranged on the surface side of the resin substrate 1 by the known face-down method. Further, a metal block 7 covers the pellet 5.

With such a structure, the metal block 7 and the substrate electrode 4, and the metal block 7 and the back surface electrode of the pellet 5 are connected via solder 8, respectively.

Specifically, the back surface electrode serving as the main electrode of the pellet 5 is connected to the substrate electrode 4 at the back surface side of the resin substrate 1 via the metal block 7 and the conductive post 3. Further, the resin substrate 1 is sealed with sealing resin 10 serving as mold resin.

In such a semiconductor device, heat generated from the pellet 5 is effectively radiated through a path reaching the conductive post 3 via the bump electrode 6 of the pellet surface and another path reaching the metal post 3 from the pellet back surface via the metal block 7.

Figure 1A:
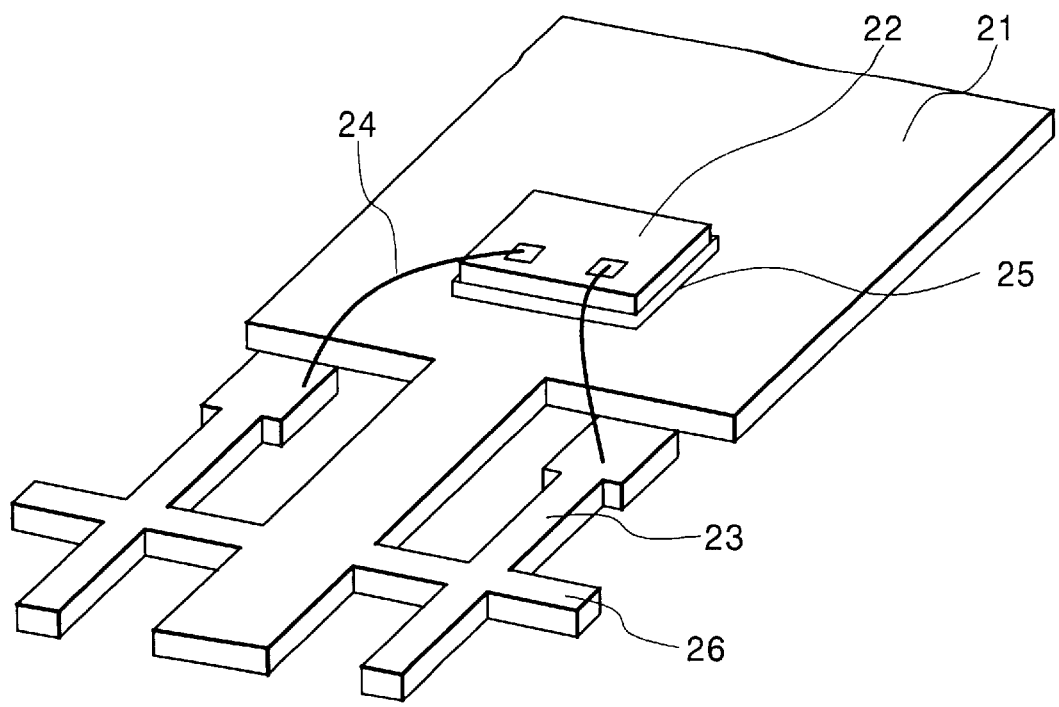
FIG. 1A is a perspective view showing a conventional example.
Figure 1B:
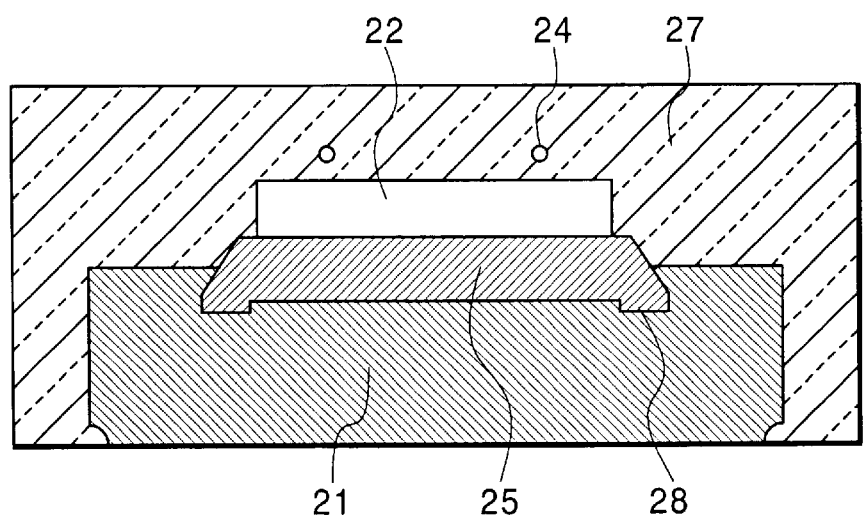
FIG. 1B is a cross sectional view showing a conventional example.

More specifically, heat-dissipation is not effectively carried out according to the conventional structure illustrated in FIG. 1 because the surface side of the pellet is covered with the sealing resin. By contrast, the heat-dissipation can be effectively performed from the surface side of the pellet 5.

Referring to FIGS. 3A through 4C, description will be made about a manufacturing method of a first embodiment according to this invention.

Figure 3A:
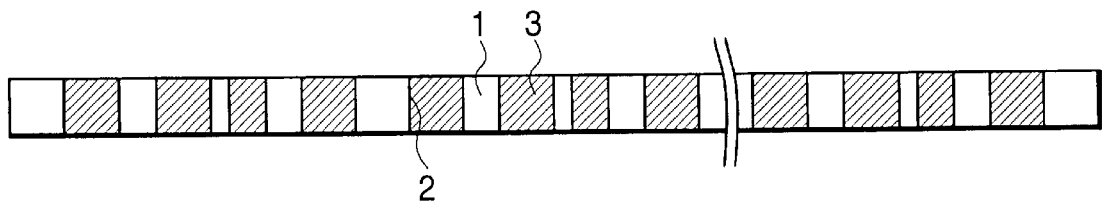
FIGS. 3A through 3C are cross sectional views showing a method of manufacturing a semiconductor device according a first embodiment.

First, the through holes 2 are opened in the resin substrate 1 consisting of the resin lamination plate by punching, as illustrated in FIG. 3A.

Further, a Cu paste is applied into the through hole 2 by the use of the known doctor blade method, and is baked to form the conductive post 3.

Figure 5:
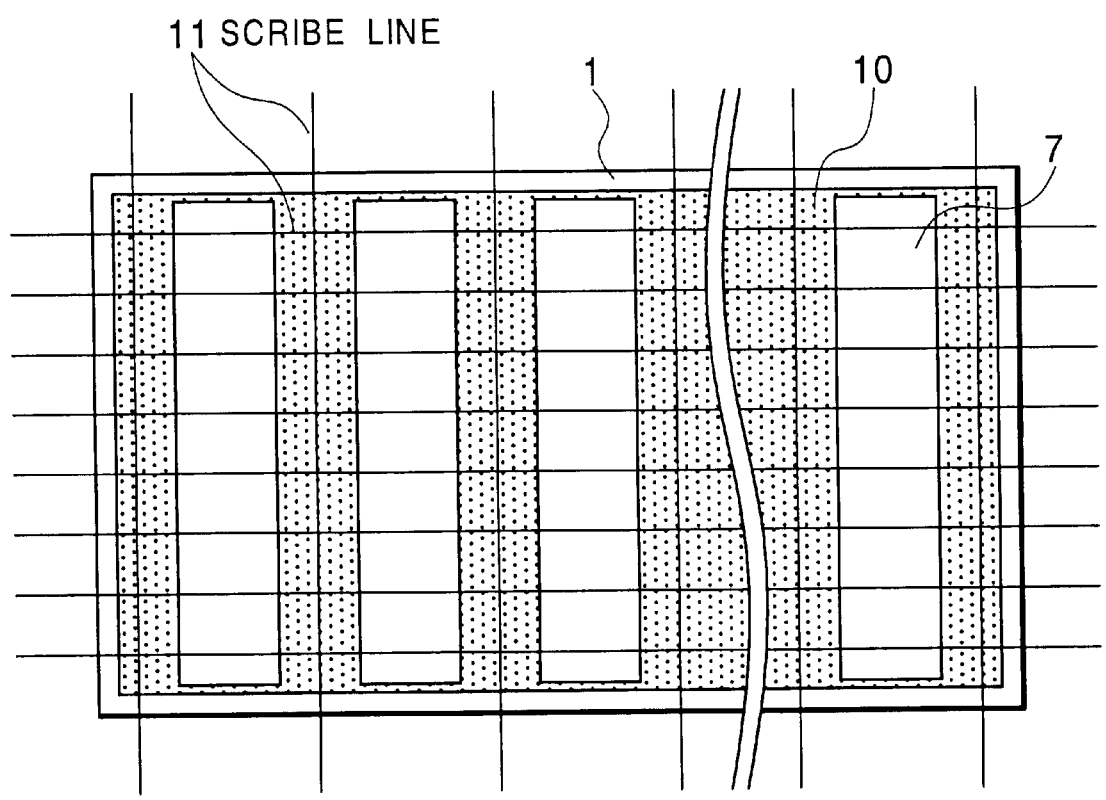
FIG. 5 is a plan view showing a manufacturing step according to a first embodiment.

In this case, the resin substrate 1 has such a length that a plurality of pellets can be provided for right and left directions in FIG. 3A. Further, the resin substrate 1 has such a length that a plurality of pellets can be also arranged in a depth direction in FIG. 3A, as shown in FIG. 5.

Figure 3B:
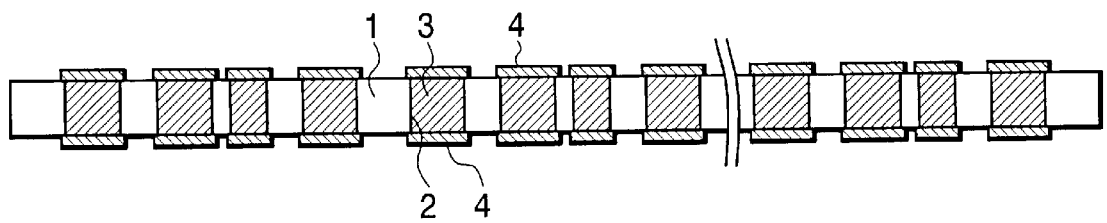

Subsequently, the Ag paste is applied on the both upper and lower surfaces of the Cu post 3 by the use of the known screen printing method, and is baked or cured to form the substrate electrode 4, as illustrated in FIG. 3B.

Figure 3C:
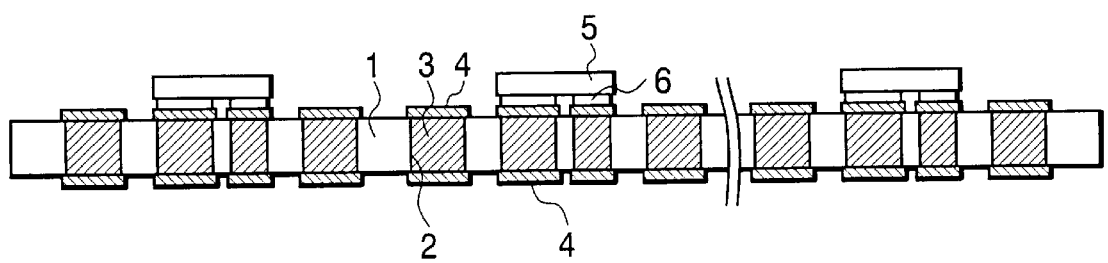

Next, the pellet 5, which has the bump electrode 6 on the upper surface and the back surface electrode at the back surface side, is turned over. The turned pellet 5 is arranged on the (face-down) substrate 1, and is heated/pressurized to connect the bump electrode 6 with the substrate electrode 4, as illustrated in FIG. 3C.

Figure 4A:
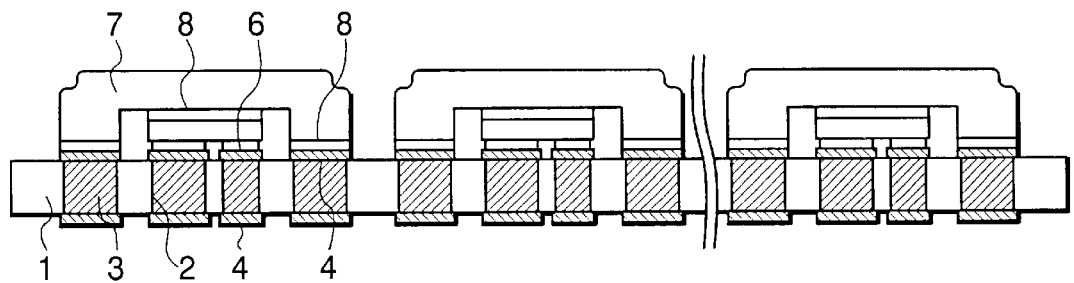
FIGS. 4A through 4C are cross sectional views showing a method of manufacturing a semiconductor device according to a first embodiment.

Successively, the solder past is applied onto the pellet 5 and for the both sides of lower surfaces of the metal block 7. Thereafter, the metal block 7 is arranged on the pellet 5. Further, the metal block 7 is stuck or secured to the substrate electrode 4 and the pellet 5 by the use of the solder 8 by passing a reflow chamber (not shown), as illustrated in FIG. 4A.

Subsequently, the resin substrate 1, which is provided with the pellet 5 and the metal block 7, is arranged inside a sealing-die 9. After the die 9 is clamped, melting epoxy based-resin is forced from a front direction of FIG. 4B, is cured during a predetermined duration, and is resin-sealed by the use of the sealing resin 10.

Figure 4B:
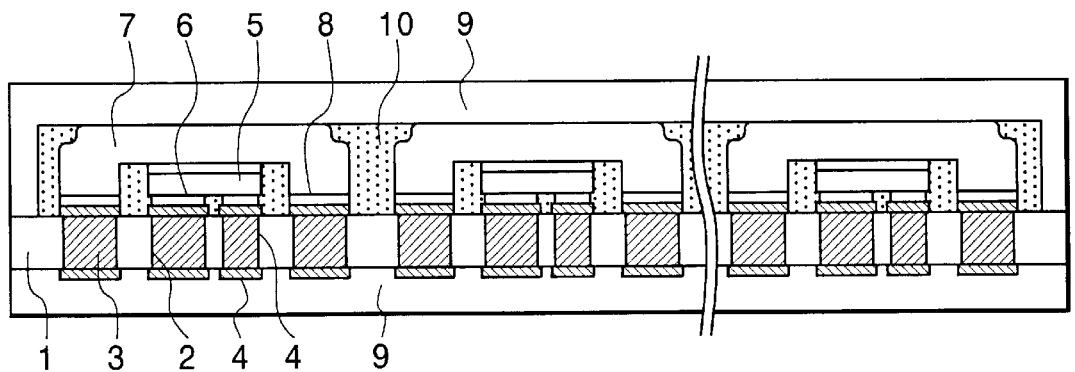
Figure 4C:
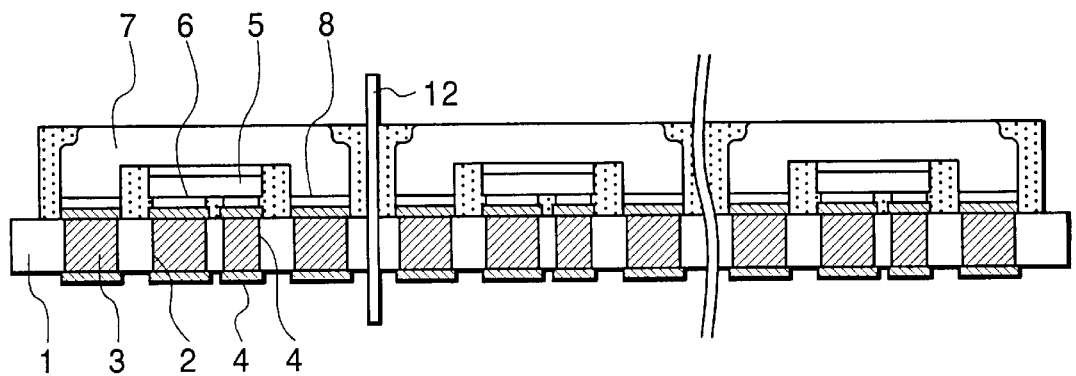

As illustrated in FIG. 5, a batch sealing product is taken out from the sealing die 9 from the condition illustrated in FIG. 4B.

Successively, the sealing product is cut by a blade 12 of a dicer (dicing saw), and is separated to the respective packages. Thereby, the semiconductor device illustrated in FIG. 2 is obtained.

(Second Embodiment)

Subsequently, description will be made about a second embodiment according to this invention.

Figure 6A:
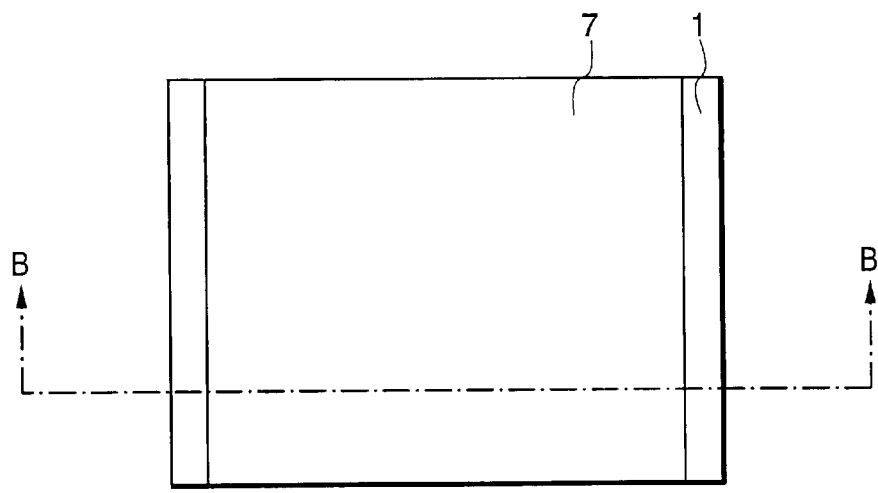
FIG. 6A is a plan view showing a semiconductor device according to a second embodiment.
Figure 6B:
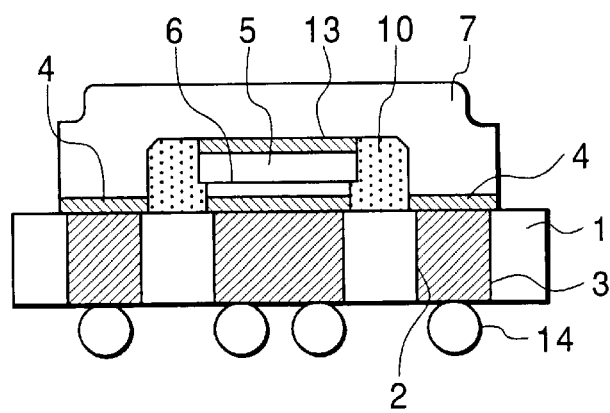
FIG. 6B is a cross sectional view showing a semiconductor device according to a second embodiment.
Figure 6C:
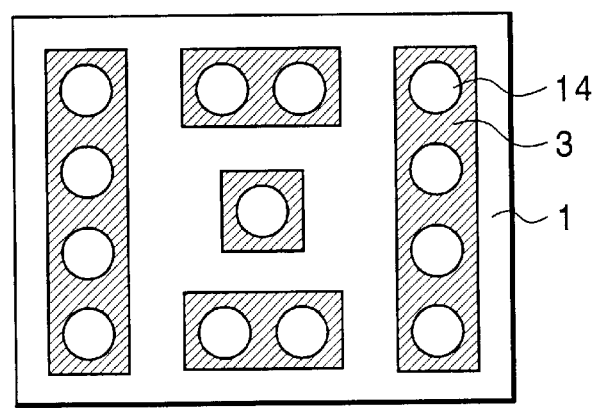
FIG. 6C is a bottom view showing a semiconductor device according to a second embodiment.

The differences between the first embodiment illustrated in FIG. 2 and the second embodiment illustrated in FIG. 6 will be explained as follows.

First, the sealing resin 10 is formed only inside the metal block 7, and is not formed on the outside surface of the metal block 7 in the second embodiment.

Second, solder balls 14 are formed instead of the substrate electrode 4 at the back surface side of the resin substrate 1. In the second embodiment, use is made of the pellet, in which the electrode is formed only at surface side.

Figure 7A:
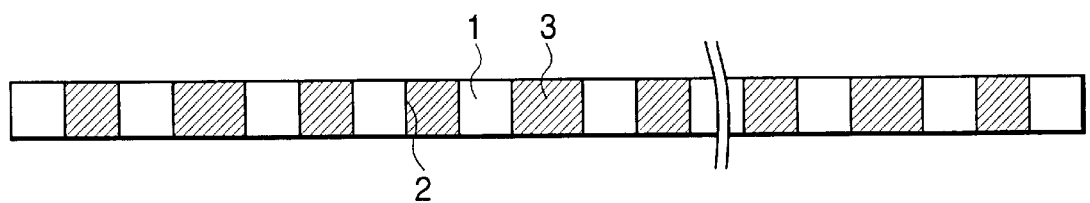
FIGS. 7A through 7C are cross sectional views showing a method of manufacturing a semiconductor device according a second embodiment.

Referring to FIGS. 7A through and 8C, description will be hereinafter made about a manufacturing method of the second embodiment according to this invention.

As illustrated in FIG. 7A, the through holes 2 are opened in the resin substrate 1, and the conductive posts 3 are formed in the through holes 2. This step is substantially equivalent to the first embodiment.

Figure 7B:
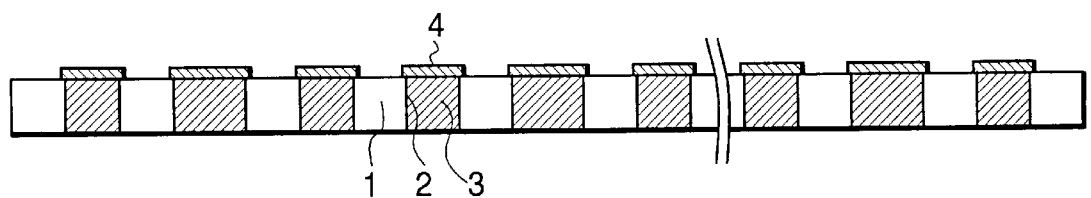
Figure 7C:
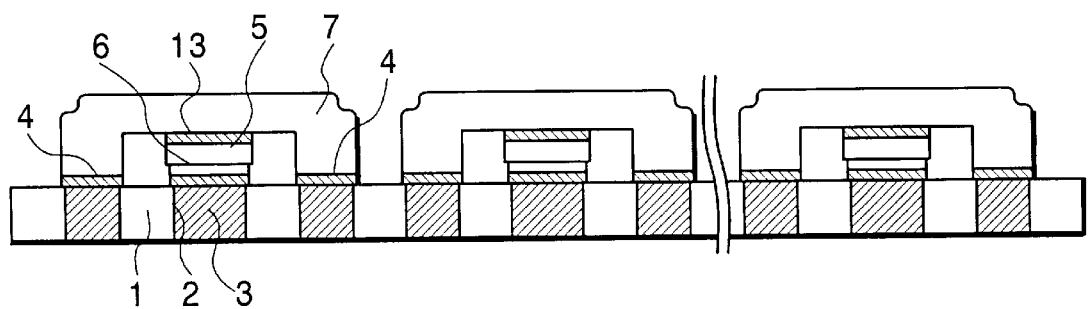

Next, the Ag paste is applied by the use of the screen printing method to form the substrate electrode 4 on the upper surface of the Cu post 3, as illustrated in FIG. 7B.

Subsequently, the pellet 5, which has the bump electrode 6 on the surface thereof, and is applied with the Ag paste serving as a conductive adhesive layer 13, is turned over. The turned pellet 5 is arranged on the substrate 1, and is covered with the metal block 7 thereon.

Successively, the pellet 5 is baked by the Ag paste, and is stuck to the resin substrate 1. Further, the metal block 7 is secured to the resin substrate 1 and the pellet 5. Herein, it is to be noted that the Ag paste serving as the conductive adhesive layer 13 may be applied at the side of the metal block 7.

Figure 8A:
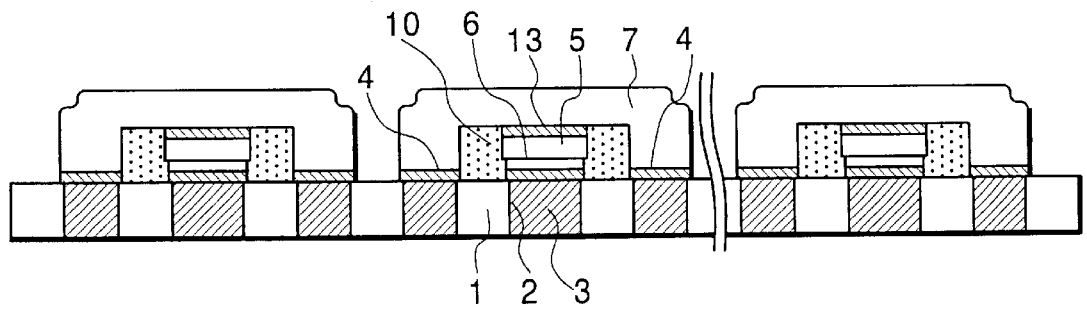
FIGS. 8A through 8C are cross sectional views showing a method of manufacturing a semiconductor device according to a second embodiment.

Subsequently, the resin substrate 1, which is provided with the pellet 5 and the metal block 7, is fallen laterally, as illustrated in FIG. 8A. Further, the sealing resin is supplied inside a space surrounded by the resin substrate 1 and the metal block 7, and is cured to form the sealing resin 10.

Figure 8B:
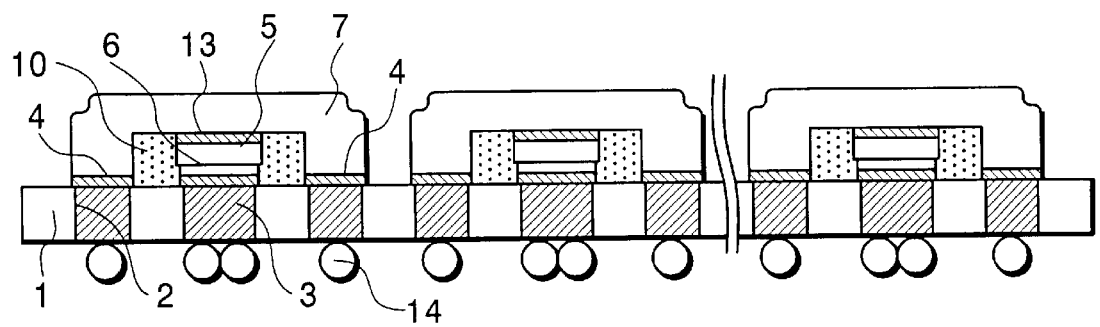
Figure 8C:
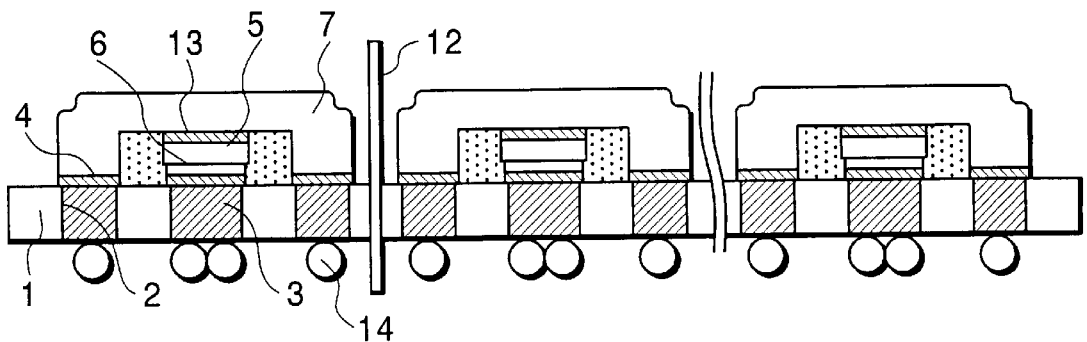

Next, the solder balls 14 are secured to the lower surface of the conductive post 3, as illustrated in FIG. 8B.

Thereafter, the resin substrate 1 and the metal block 7 are cut by the blade 12 of the dicer, and are separated to the respective packages. Thus, the semiconductor substrate illustrated in FIG. 6 is obtained.

While this invention has thus far been disclosed in conjunction with several embodiments thereof, it will be readily possible for those skilled in the art to put this invention into practice in various other manners.

For example, the other material may be used in lieu of the Cu paste or the Ag paste.

Further, the resin sealing may not always be carried out in the state illustrated in FIG. 5. Alternatively, the resin sealing may be performed after separating at every one line (row) or a plurality of scribe lines 11 (rows) in the lateral direction in FIG. 5.

Moreover, in the case where the metal block is simultaneously stuck to the substrate and the pellet, the solder paste can be used as the conductive material as a securing member.

In addition, the though hole for the resin substrate may be opened by the use of drilling instead of punching.

What is claimed is:

1. A semiconductor device, comprising:

an insulating substrate which has a plurality of upper substrate electrodes at a first surface and a plurality of lower substrate electrodes at a second surface disposed at an opposite side to said first surface, each of said lower substrate electrodes being associated with each of said upper substrate electrodes;

a semiconductor element which has at least one surface electrode at a surface side thereof, said surface electrode being arranged on at least one of said upper substrate electrodes; and a metal block which has a ceiling portion and end portions, said ceiling portion and a back surface of the semiconductor element are connected via solder, and said end portions and others of said upper substrate electrodes are connected via solder, respectively;

wherein an entire space enclosed by said metal block and said insulating substrate, is filled with resin except for the space occupied by said plurality of upper substrate electrodes, said semiconductor element, said at least one surface electrode of said semiconductor element, and said solder.

2. A device as claimed in claim 1, wherein:

each of the lower substrate electrodes is connected to each of the upper substrate electrodes by means of a conductive post buried in a through-hole.

3. A device as claimed in claim 2, wherein:

the conductive post is formed by the use of Cu paste.

4. A device as claimed in claim 1, wherein:

each of the lower substrate electrode and the upper substrate electrode is formed by the use of Ag paste.

5. A device as claimed in claim 1, wherein:

the insulating substrate comprises a resin substrate.

* * * * *